(12) United States Patent
Kuriyagawa et al.

(10) Patent No.: US 10,115,774 B2
(45) Date of Patent: Oct. 30, 2018

(54) DISPLAY DEVICE AND METHOD OF MANUFACTURING THE SAME

(71) Applicant: Japan Display Inc., Tokyo (JP)

(72) Inventors: Takeshi Kuriyagawa, Tokyo (JP); Kazufumi Watabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/242,799

(22) Filed: Aug. 22, 2016

(65) Prior Publication Data

US 2017/0062761 A1    Mar. 2, 2017

(30) Foreign Application Priority Data

Aug. 27, 2015    (JP) .................................. 2015-168186

(51) Int. Cl.
*H01L 51/52* (2006.01)
*H01L 27/32* (2006.01)

(52) U.S. Cl.
CPC ........ *H01L 27/3244* (2013.01); *H01L 51/525* (2013.01); *H01L 51/5246* (2013.01); *H01L 51/5253* (2013.01)

(58) Field of Classification Search
CPC .................................................. H01L 51/5253
See application file for complete search history.

(56) References Cited

U.S. PATENT DOCUMENTS

| | | | |
|---|---|---|---|
| 5,686,360 A * | 11/1997 | Harvey, III | H01L 51/0097 438/126 |
| 9,397,149 B2 * | 7/2016 | Yamazaki | H01L 27/3262 |
| 2002/0024096 A1 * | 2/2002 | Yamazaki | H01L 27/1214 257/359 |
| 2010/0244005 A1 * | 9/2010 | Gyoda | H01L 51/5237 257/40 |
| 2011/0114994 A1 * | 5/2011 | Mandlik | C23C 16/02 257/100 |

(Continued)

FOREIGN PATENT DOCUMENTS

| | | |
|---|---|---|
| CN | 102223760 A | 10/2011 |
| CN | 103839973 A | 6/2014 |

(Continued)

OTHER PUBLICATIONS

Chinese Office Action dated Oct. 23, 2017, for corresponding Chinese Patent Application No. 201610757709.5.

(Continued)

*Primary Examiner* — Victoria K Hall
(74) *Attorney, Agent, or Firm* — Typha IP LLC

(57) ABSTRACT

A base body including a plurality of first regions and a second region having a shape surrounding each of the first regions is prepared. A resin layer is formed in the plurality of first regions while avoiding the second region. A buried layer having a moisture-proof property higher than the resin layer is formed in the second region. A functional layer including a self-emitting element layer emitting light whose luminance is controlled for each of a plurality of unit pixels constituting an image is formed on the resin layer and the buried layer. The buried layer and the functional layer are cut along a line passing through the second region, so as to separate the resin layer into a plurality of portions respectively corresponding to the plurality of first regions.

20 Claims, 17 Drawing Sheets

(56) References Cited

U.S. PATENT DOCUMENTS

| | | | |
|---|---|---|---|
| 2011/0156062 A1 | 6/2011 | Kim et al. | |
| 2013/0248891 A1* | 9/2013 | Kim | H01L 51/0097 257/88 |
| 2014/0027791 A1* | 1/2014 | Cho | H01L 33/44 257/88 |
| 2014/0159078 A1* | 6/2014 | Kim | H01L 51/0013 257/89 |
| 2014/0190621 A1 | 7/2014 | Kawata et al. | |
| 2015/0028307 A1* | 1/2015 | Kim | H01L 51/56 257/40 |
| 2015/0123106 A1* | 5/2015 | Yasumoto | B32B 43/006 257/40 |
| 2016/0013256 A1* | 1/2016 | Gai | G09G 3/32 257/40 |
| 2016/0072099 A1* | 3/2016 | Okamoto | H01L 51/5253 257/40 |
| 2016/0093685 A1* | 3/2016 | Kwon | H01L 27/3276 257/40 |
| 2016/0118416 A1* | 4/2016 | Yamazaki | H01L 27/1225 349/38 |
| 2016/0147109 A1* | 5/2016 | Yamazaki | G02F 1/133345 349/42 |
| 2016/0164030 A1* | 6/2016 | Yasuda | H01L 51/0097 349/122 |
| 2016/0190055 A1* | 6/2016 | Jinbo | H01L 27/3276 257/99 |
| 2016/0204183 A1* | 7/2016 | Tao | H01L 51/0097 257/40 |
| 2016/0204366 A1* | 7/2016 | Zhang | H01L 23/4985 257/40 |
| 2017/0040569 A1* | 2/2017 | Watabe | H01L 27/3244 |
| 2017/0047547 A1* | 2/2017 | Son | H01L 51/5253 |
| 2017/0054106 A1* | 2/2017 | Jeon | H01L 51/5253 |
| 2017/0179386 A1* | 6/2017 | Watabe | H01L 51/003 |
| 2018/0175115 A1* | 6/2018 | Choi | H01L 27/322 |

FOREIGN PATENT DOCUMENTS

| | | |
|---|---|---|
| CN | 104409662 A | 3/2015 |
| JP | 2002-151253 A | 5/2002 |
| JP | 2006-185679 A | 7/2006 |
| JP | 2009-037798 A | 2/2009 |
| JP | 2011-227369 A | 11/2011 |
| JP | 2014-149517 A | 8/2014 |
| JP | 2014-235294 A | 12/2014 |
| KR | 10-0420749 B1 | 5/2004 |
| WO | 2010/024006 A1 | 3/2010 |
| WO | 2014/174892 A | 10/2014 |

OTHER PUBLICATIONS

Korean Office Action dated Oct. 13, 2017 for corresponding Korean Patent Application No. 10-2016-0101033.

Japanese Office Action dated Jul. 3, 2018 for corresponding Japanese Patent Application No. 2015-168186 with machine translation.

* cited by examiner

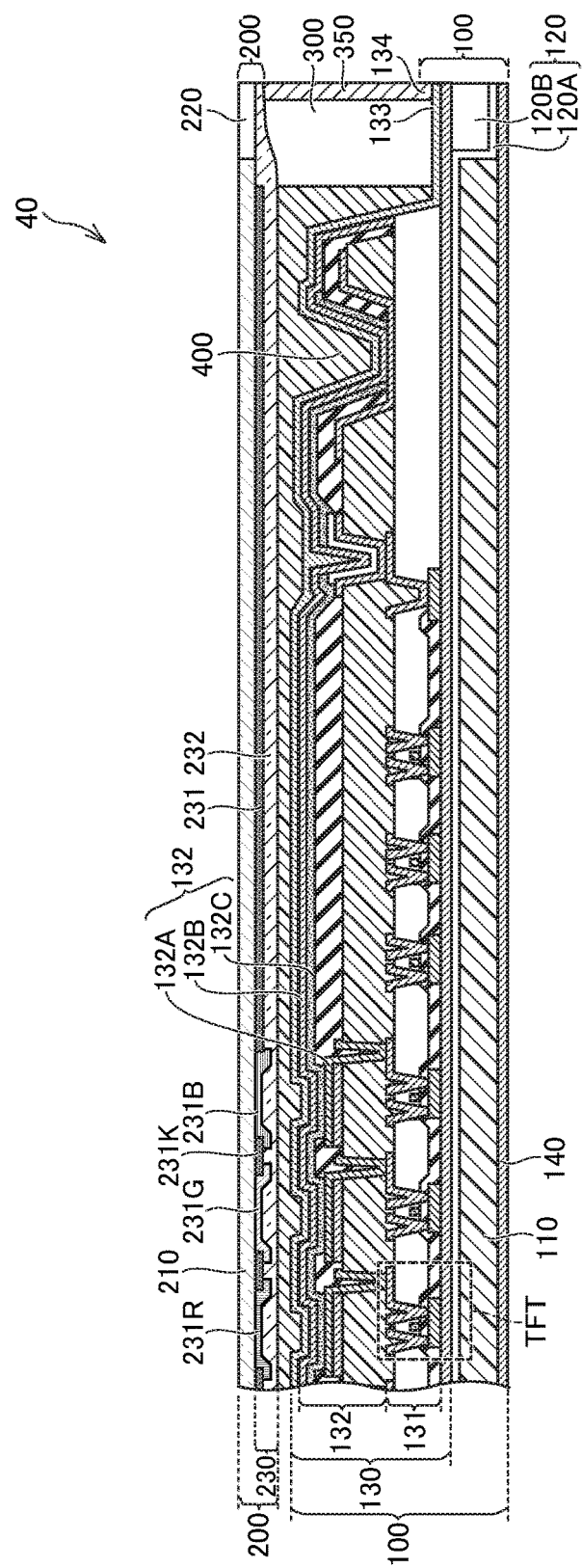

DISPLAY DEVICE AND METHOD OF MANUFACTURING THE SAME

CROSS-REFERENCE TO RELATED APPLICATION

The present application claims priority from Japanese application JP2015-168186 filed on Aug. 27, 2015, the content of which is hereby incorporated by reference into this application.

BACKGROUND OF THE INVENTION

1. Field of the Invention

The present invention relates to a display device and a method of manufacturing the same.

2. Description of the Related Art

As a display device of an information communication terminal such as a computer or a mobile phone, or the like, display devices including a pair of substrates are widely used. As the display device, a display device having flexibility has been recently developed. For the display device, a thin film transistor (TFT) substrate including thin film transistors formed on a resin substrate having flexibility, or a color filter substrate including a color filter formed on a resin substrate is used.

As a method of manufacturing the display device having flexibility, JP 2006-185679 A discloses a method, in which a TFT mother substrate and a counter mother substrate are bonded together, and thereafter, the TFT substrate and the counter substrate are cut for each of display areas.

Further, JP 2014-149517 A discloses a structure in which a member integrated with a black matrix is provided on a counter substrate of polyimide to cover the periphery of the counter substrate.

As a method of manufacturing middle- and small-sized display devices, a method is known in which a large-sized panel for obtaining multiple pieces is divided to obtain display devices of a desired size. With the panel for obtaining multiple pieces, a plurality of display devices can be obtained by forming a plurality of middle- and small-sized display devices on a base body formed of a glass substrate or the like, and then scribing (for example, making a score using a needle made of metal or the like, or making a score with a laser beam) and breaking (cutting along the scribed score) the base body.

When a flexible display device is manufactured by the method described above, a base body on which a flexible resin film is formed is divided, and thus, in the side surface of the display device manufactured, a cross-section of the side surface of the resin film is exposed to the outside.

Here, since the resin film has a poor moisture barrier property, external moisture may enter the interior of the display device through the resin film. If the moisture enters the interior of the display device, the moisture causes a display defect or the like, and the reliability of the display device is reduced.

SUMMARY OF THE INVENTION

It is an object of the invention to provide a display device whose moisture barrier property is enhanced and thus whose reliability is improved, and a method of manufacturing the display device.

The above and other objects and novel features of the invention will become apparent from the description of the specification and the accompanying drawings.

A method of manufacturing a display device according to an aspect of the invention includes the steps of: preparing a base body including a plurality of first regions and a second region having a shape surrounding each of the first regions, and forming a resin layer in the plurality of first regions while avoiding the second region; forming, in the second region, a buried layer having a moisture-proof property higher than the resin layer; forming, on the resin layer and the buried layer, a functional layer including a self-emitting element layer emitting light whose luminance is controlled for each of a plurality of unit pixels constituting an image; and cutting the buried layer and the functional layer along a line passing through the second region, so as to separate the resin layer into a plurality of portions respectively corresponding to the plurality of first regions.

Moreover, a display device according to another aspect of the invention includes: a first resin layer; a first frame body provided around the first resin layer so as to include a portion overlying an upper surface of the first resin layer; and a functional layer stacked on the upper surface of the first resin layer and an upper surface of the first frame body and including a self-emitting element layer emitting light whose luminance is controlled for each of a plurality of unit pixels constituting an image.

BRIEF DESCRIPTION OF THE DRAWINGS

FIG. 8 is a cross-sectional view showing the configuration of a display device according to a fourth embodiment.

DETAILED DESCRIPTION OF THE INVENTION

[Display Device According to First Embodiment]

First, an overview of a display device according to a first embodiment of the invention will be described with reference to FIGS. 1 to 3.

Figure 1:
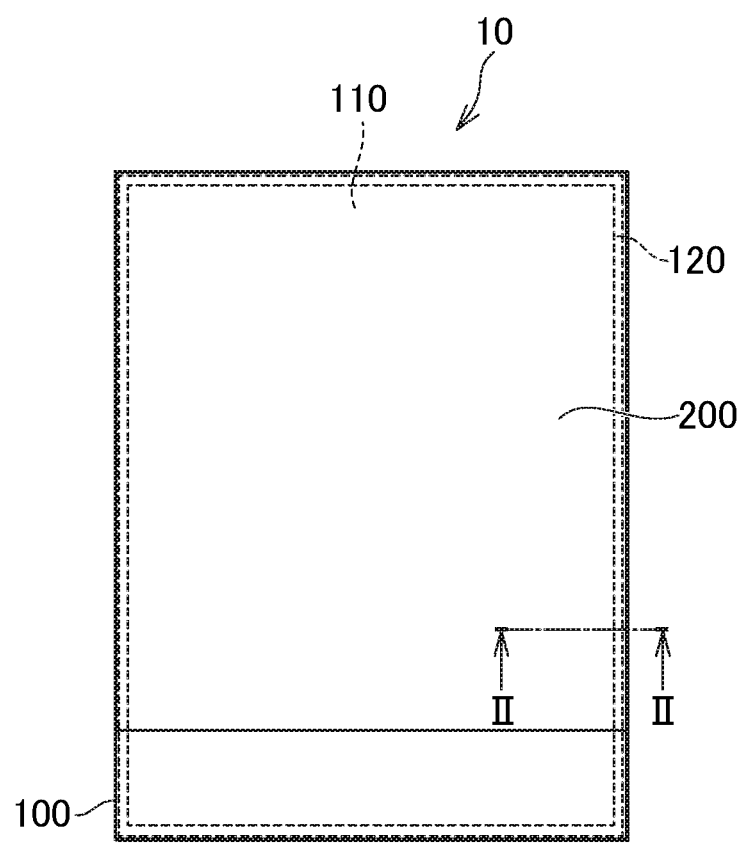
FIG. 1 is a plan view schematically showing a display device according to a first embodiment of the invention.

FIG. 1 is a plan view schematically showing the display device according to the first embodiment of the invention. FIG. 2 is a diagram showing across-section along the section line II-II in FIG. 1, showing the configuration of the display device according to the first embodiment. FIG. 3 is a diagram showing, in an enlarged manner, a region surrounded by the broken line III in FIG. 2.

The display device 10 according to the first embodiment of the invention includes a first substrate 100 including a functional layer configured to include a self-emitting element layer 132, and a second substrate 200 as a counter substrate.

First, the configuration of the first substrate 100 will be described. The first substrate 100 is configured to include a first resin layer 110 formed of flexible resin, and a first functional layer 130 formed on the first resin layer 110.

The first resin layer 110 is formed of a material having excellent softness and flexibility, and may be formed of, for example, polyimide or polyethylene terephthalate (PET).

Moreover, a first protective film 140 that blocks external moisture may be attached on the lower surface side (side opposite to the side facing a thin film transistor (TFT) layer 131 described later) of the first resin layer 110. The first protective film 140 may be realized by, for example, a polyethylene film, an aluminum film, or the like.

Figure 2:
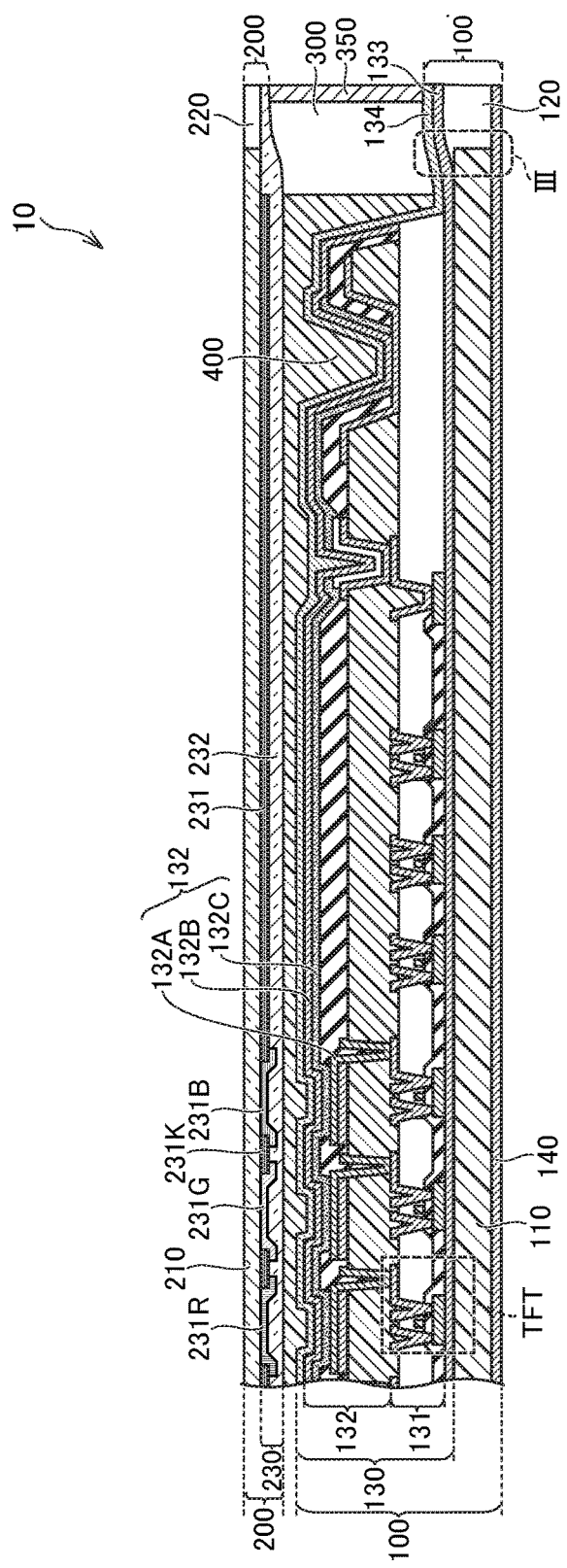
FIG. 2 is a diagram showing a cross-section along the section line II-II in FIG. 1, showing the configuration of the display device according to the first embodiment.

As shown in FIG. 2, a first frame body 120 provided so as to include a portion that overlies the upper surface (surface on the side facing the TFT layer 131 described later) of the first resin layer 110 is provided on a side surface portion of the first resin layer 110. As shown in FIG. 1, the first frame body 120 is provided around the first resin layer 110.

Moreover, in order to provide the first frame body 120 so as to overlie the upper surface of the first resin layer 110, the thickness of the first frame body 120 may be larger than the thickness of the first resin layer 110.

The first frame body 120 provided in the display device 10 is formed so as to be buried around the first resin layer 110 in the manufacturing method thereof, which will be described in detail later. Hence, hereinafter, the first frame body 120 is referred to as "first buried layer 120" in the following description.

Figure 3:
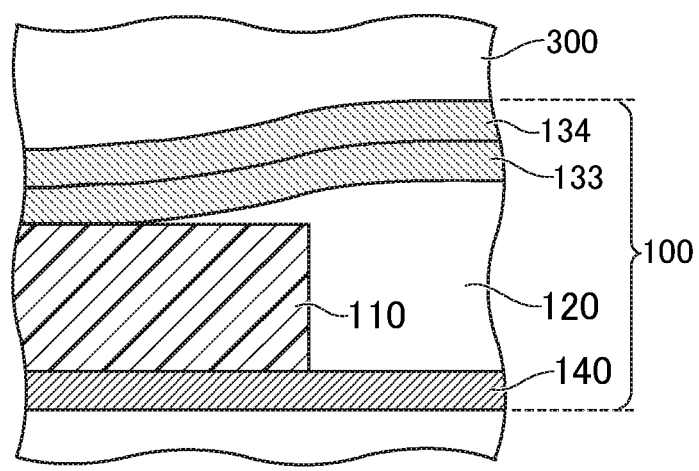
FIG. 3 is a diagram showing, in an enlarged manner, a region surrounded by the broken line III in FIG. 2.

As shown in FIG. 3, the first buried layer 120 is formed so as to be buried around the first resin layer 110, and thus is provided so as to include the portion overlying the upper surface of the first resin layer 110.

The moisture-proof property of the material forming the first buried layer 120 is higher than the moisture-proof property of the material forming the first resin layer 110.

That is, the moisture-proof property of the first buried layer 120 is higher than the moisture-proof property of the first resin layer 110.

The first buried layer 120 may be formed of an inorganic material. The first resin layer 110 is formed of an organic resin such as polyimide as described above. An organic resin has high affinity for water, compared with an inorganic material, and thus is likely to pick up moisture due to external water vapor or the like, and therefore, the moisture-proof property of the organic resin is low.

If external moisture enters the interior of the display device 10 through the first resin layer 110, the self-emitting element layer 132 or the like is adversely affected, and thus a display defect or the like may be caused.

The first buried layer 120 provided in the display device 10 is formed so as to cover the outer surface of the first resin layer 110 in order to inhibit the entry of external moisture into the interior of the display device 10. Moreover, since the first buried layer 120 is provided so as to cover a portion of the upper surface of the first resin layer 110, the entry of moisture into the interior of the display device 10 is further inhibited.

As shown in FIG. 2, the first functional layer 130 may include the TFT layer 131, the self-emitting element layer 132 formed on the side of the TFT layer 131 opposite to the side facing the first resin layer 110, a first barrier layer 133 provided between the TFT layer 131 and the first resin layer 110, and a second barrier layer 134 formed on the side of the self-emitting element layer 132 opposite to the side facing the TFT layer 131.

As shown in FIG. 2, the second barrier layer 134 may be disposed so as to enclose the side surface of the TFT layer 131 and the edge surface of the self-emitting element layer 132. The first barrier layer 133 and the second barrier layer 134 constituting portions of the first functional layer 130 protect the interior of the first functional layer 130 against external contamination such as a corrosive gas, moisture, or metal ions.

The first barrier layer 133 and the second barrier layer 134 may be formed of, for example, a metal oxide such as $Al_2O_3$ or $SiO_2$, or a metal nitride such as SiN. Moreover, the first barrier layer 133 and the second barrier layer 134 may be formed using, for example, a chemical vapor deposition (CVD) method, a physical vapor deposition (PVD) method, or an atomic layer deposition (ALD) method.

The TFT layer 131 constituting a portion of the first functional layer 130 includes pixels including thin film transistors (TFTs) and disposed in a matrix on the first resin layer 110.

The TFT constituting a portion of the TFT layer 131 may include a semiconductor film such as polysilicon, agate insulating film covering the semiconductor film, a gate electrode disposed above the semiconductor film with the gate insulating film therebetween, and source and drain electrodes penetrating the gate insulating film to be electrically connected to the semiconductor film. A control circuit (not shown) for controlling the plurality of TFTs constituting the TFT layer 131 may be disposed on, for example, the first resin layer 110 described above.

The self-emitting element layer 132 constituting a portion of the first functional layer 130 is provided so as to emit light whose luminance is controlled for each of a plurality of unit pixels constituting an image. The self-emitting element layer 132 includes a common electrode 132B, a plurality of pixel electrodes 132A located between the common electrode 132B and the TFT layer 131, and a light-emitting layer 132C intervening between the common electrode 132B and the plurality of pixel electrodes 132A.

The common electrode 132B may be formed of a conductive film made of transparent metal such as indium tin oxide (ITO) or indium zinc oxide (IZO).

The light-emitting layer 132C in the specification may be an organic light-emitting layer or an inorganic light-emitting layer represented by a quantum-dot light-emitting diode (QLED) or the like. The organic light-emitting layer may include an electron transport layer, a hole transport layer, an electron injection layer, and a hole injection layer.

The light-emitting layer 132C in the display device 10 according to the first embodiment is formed of a material that emits light of a single color (white), and is provided continuously for the plurality of pixel electrodes 132A. As another aspect, the light-emitting layer 132C may be provided to be divided into light-emitting portions of a plurality of colors (for example, three colors of red (R), green (G), and blue (B)) for the respective pixel electrodes 132A.

Next, the configuration of the second substrate 200 will be described. The second substrate 200 is configured to include a second resin layer 210 formed of flexible resin, and a second functional layer 230 formed on the second resin layer 210.

The second resin layer 210 is formed of a material having excellent softness and flexibility, and may be formed of, for example, polyimide or polyethylene terephthalate (PET).

Moreover, a second protective film (not shown) that inhibits external physical damage or the like may be attached on the upper surface side (side opposite to the side facing a color filter layer 231 described later) of the second resin layer 210. The second protective film may be realized by, for example, a polyethylene film or the like.

A second frame body 220 provided so as to surround the periphery of the second resin layer 210 may be provided on a side surface portion of the second resin layer 210. The second frame body 220 may be disposed such that at least a portion thereof overlaps the first frame body 120 and a sealing material 300 described later in a plan view.

The second frame body 220 provided so as to surround the periphery of the second resin layer 210 is formed so as to be buried around the second resin layer 210 in the manufacturing method thereof, which will be described in detail later. Hence, hereinafter, the second frame body 220 is referred to as "second buried layer 220" in the following description.

The moisture-proof property of the material forming the second buried layer 220 may be higher than the moisture-proof property of the material forming the second resin layer 210.

The second buried layer 220 may be formed of an inorganic material. The second resin layer 210 is formed of an organic resin such as polyimide as described above. If external moisture enters the interior of the second substrate 200 through the second resin layer 210, some properties such as display performance may be impaired due to a frosted interior of the second substrate 200.

The second buried layer 220 provided in the display device 10 is formed so as to cover the side edge surface of the second resin layer 210 in order to inhibit the entry of external moisture into the interior of the display device 10.

As shown in FIG. 2, the second functional layer 230 may include the color filter layer 231 and a third barrier layer 232 formed on the side of the color filter layer 231 opposite to the side facing the second resin layer 210.

The color filter layer 231 constituting a portion of the second functional layer 230 may be configured to include colored layers 231R, 231G, and 231B of red (R), green (G), and blue (B) as shown in FIG. 2. When the light emitted from the self-emitting element layer 132 described above is of a single color (white), the light (white) emitted from the self-emitting element layer 132 passes through the colored layers 231R, 231G, and 231B of the respective colors and thus is visually recognized as the respective colors of red (R), green (G), and blue (B) outside the display device.

The colored layers 231R, 231G, and 231B included in the color filter layer 231 may respectively include therein pigments of the respective colors of red (R), green (G), and blue (B) dispersed in resin.

The color filter layer 231 may include a black matrix 231K between the colored layers 231R, 231G, and 231B of the respective colors in order to prevent the light transmitted through each of the regions of the respective colors from entering an adjacent region of the other color. The black matrix 231K may include therein a black pigment dispersed in resin.

When the light-emitting layer 132C constituting a portion of the first functional layer 130 is a light-emitting layer 132C of a so-called separate coloring type where the light-emitting layer 132C is divided into light-emitting portions of a plurality of colors (for example, three colors of red (R), green (G), and blue (B)), the second functional layer 230 may not include the color filter layer 231.

The third barrier layer 232 constituting a portion of the second functional layer 230 protects the interior of the second functional layer 230 against external contamination such as a corrosive gas, moisture, or metal ions. The third barrier layer 232 may be formed of, for example, a metal oxide such as $Al_2O_3$ or $SiO_2$, or a metal nitride such as SiN. Moreover, the third barrier layer 232 may be formed using, for example, a CVD method, a PVD method, or an ALD method.

In the display device 10 according to the first embodiment, the first substrate 100 described above and the second substrate 200 as a counter substrate may be bonded to each other through the sealing material 300 (also referred to as "dam material") and/or a filling material 400.

As shown in FIG. 2, in the display device 10 according to the first embodiment, the second barrier layer 134 constituting a portion of the first substrate 100 and the second substrate 200 are bonded to each other through the filling material 400 and the sealing material 300 disposed so as to enclose the periphery of the filling material 400 in a plan view.

Moreover, as shown in FIG. 2, since the first substrate 100 and the second substrate 200 are bonded together as described above, the first barrier layer 133 and the second barrier layer 134 are interposed between the sealing material 300 and the first buried layer 120.

The filling material 400 may be, for example, a photocurable resin or the like. When the filling material 400 is formed of a photocurable resin, the bonding of the first substrate 100 and the second substrate 200 together may be performed as follows: the sealing material 300 is provided at the peripheral edge of a region where the filling material 400 is disposed; the photocurable resin before curing is poured into the region surrounded by the sealing material 300; and thereafter, the photocurable resin is photocured.

Moreover, a spacer 350 may be provided between the first substrate 100 and the second substrate 200 as a counter substrate in order to make a gap between the substrates uniform. The spacer 350 may be provided only in a region outside the sealing material 300. Moreover, the spacer 350 may be provided so as to be buried in a space between the edge portion of the first substrate 100 and the edge portion of the second substrate 200.

As shown in FIG. 2, the display device 10 according to the first embodiment is provided with the spacer 350 disposed between the second barrier layer 134 and the second substrate 200, on the side of the sealing material 300 opposite to the side facing the filling material 400.

[Display Device According to Second Embodiment]

Figure 4:
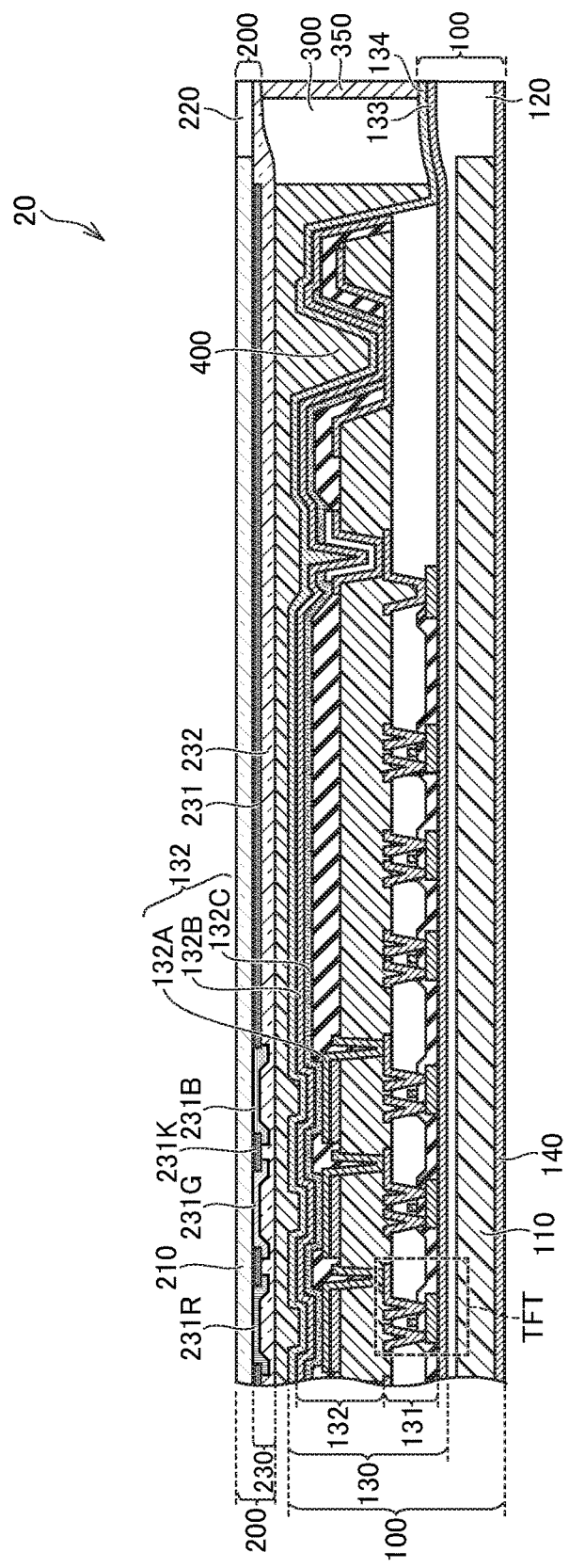
FIG. 4 is a cross-sectional view showing the configuration of a display device according to a second embodiment.

Hereinafter, a display device 20 according to a second embodiment of the invention will be described with reference to FIG. 4. FIG. 4 is a cross-sectional view showing the configuration of the display device according to the second embodiment.

In the display device 20 according to the second embodiment, the shape of the first buried layer 120 is different from the shape of the first buried layer 120 provided in the display device 10 according to the first embodiment. The configuration of the display device 20 according to the second embodiment other than the first buried layer 120 is similar to that of the display device 10 according to the first embodiment.

The first buried layer 120 constituting a portion of the display device 20 according to the second embodiment is provided around the first resin layer 110 in a plan view, and also provided so as to cover the entire upper surface (surface on the side facing the TFT layer 131) of the first resin layer 110.

Since the first buried layer 120 of the display device 20 according to the second embodiment is provided around the first resin layer 110 and so as to cover the entire upper surface thereof, the entry of moisture into the interior of the display device 20 is further inhibited compared with the display device 10 according to the first embodiment.

[Method of Manufacturing Display Device According to First Embodiment]

Figure 5:
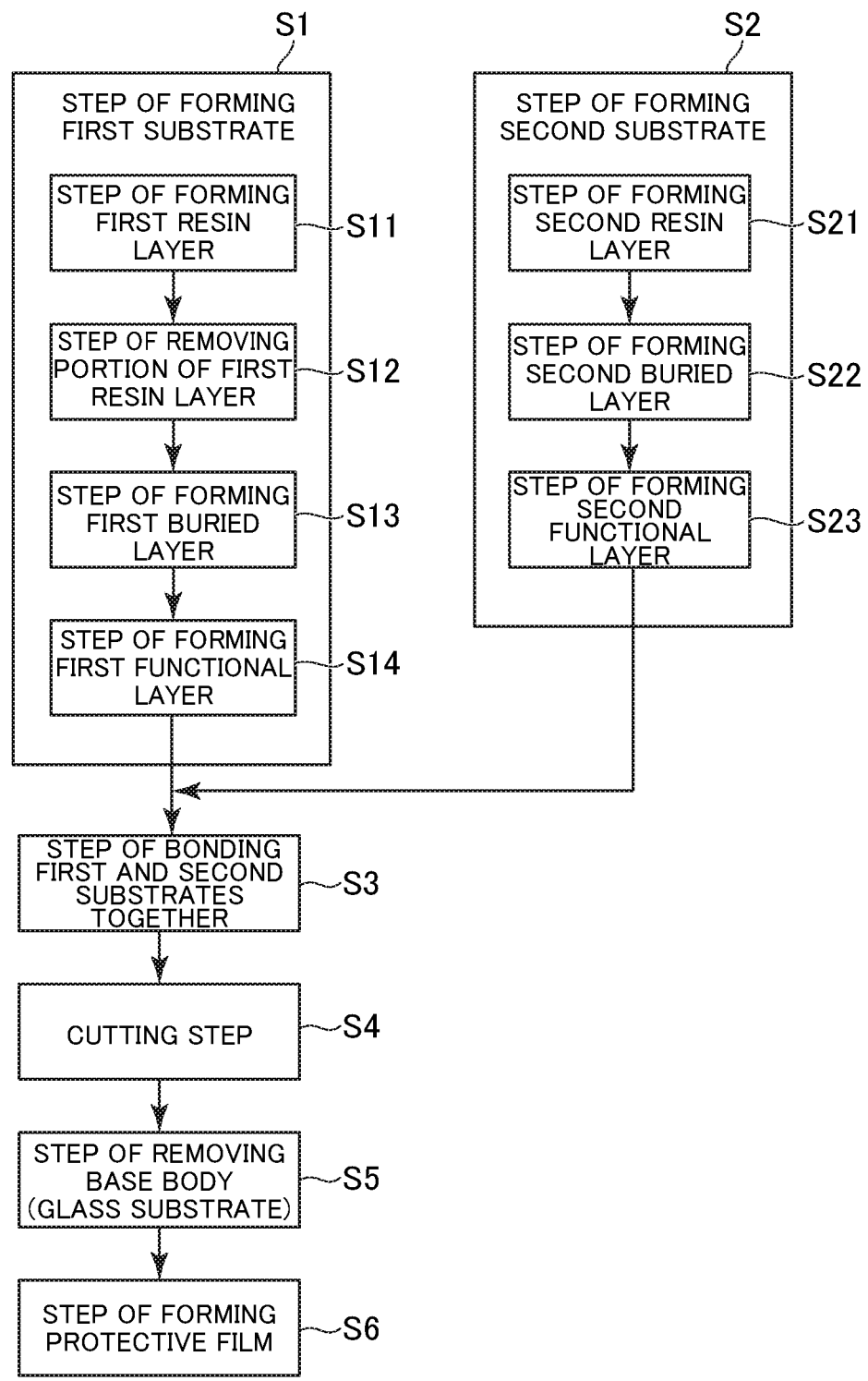
FIG. 5 is a flowchart for explaining a method of manufacturing the display device according to the first embodiment.

Next, a method of manufacturing the display device according to the first embodiment will be described. FIG. 5 is a flowchart for explaining the method of manufacturing the display device according to the first embodiment.

As shown in FIG. 5, the method of manufacturing the display device 10 according to the first embodiment may include a step of forming the first substrate S1 and a step of forming the second substrate S2.

The step of forming the first substrate S1 includes: a step of preparing a first base body 500 including a plurality of first regions and a second region having a shape surrounding each of the first regions, and forming the first resin layer 110 in the plurality of first regions while avoiding the second region (a step of forming the first resin layer S11 and a step of removing a portion of the first resin layer S12); a step of forming, in the second region, the first buried layer 120 having a moisture-proof property higher than the first resin layer 110 (a step of forming the first buried layer S13); and a step of forming, on the first resin layer 110 and the first buried layer 120, the first functional layer 130 including the self-emitting element layer 132 emitting light whose luminance is controlled for each of the plurality of unit pixels constituting an image (a step of forming the first functional layer S14).

Moreover, the method of manufacturing the display device 10 according to the first embodiment includes a step of cutting the first buried layer 120 and the first functional layer 130 along a line passing through the second region, so as to separate the first resin layer 110 into a plurality of portions respectively corresponding to the plurality of first regions (a cutting step S4).

The cutting line, which is the line passing through the second region and along which the first buried layer 120 and the first functional layer 130 are cut in the cutting step S4 described in detail later, is indicated by Sign SL in FIGS. 6A to 6K.

Moreover, the step of forming the second substrate S2 may include: a step of preparing a second base body 600 and forming the second resin layer 210 on the second base body 600 (a step of forming the second resin layer S21); a step of forming the second buried layer 220 having a moisture-proof property higher than the second resin layer 210 (a step of forming the second buried layer S22); and a step of forming, on the second resin layer 210 and the second buried layer 220, the second functional layer 230 including the color filter layer 231 (a step of forming the second functional layer S23).

Hereinafter, the steps in the method of manufacturing the display device 10 according to the first embodiment will be described with reference to FIGS. 6A to 6K.

Figure 6A:
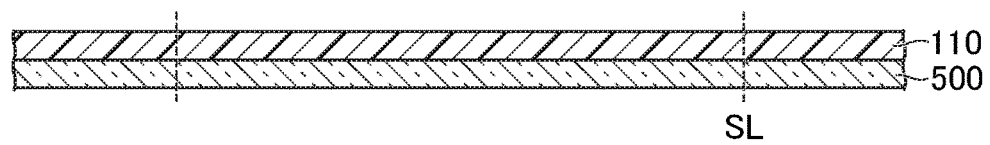
FIG. 6A is a diagram for explaining the method of manufacturing the display device according to the first embodiment, showing a state where a first resin layer is stacked on a first base body.

FIG. 6A is a diagram for explaining the method of manufacturing the display device according to the first embodiment, showing a state where the first resin layer is stacked on the first base body.

In the manufacture of the display device according to the first embodiment, the flexible first resin layer 110 is formed on the first base body 500 first prepared (the step of forming the first resin layer S11). The step of forming the first resin layer S11 is a step of preparing the first base body 500 including the plurality of first regions and the second region having the shape surrounding each of the first regions, and forming the first resin layer 110 in the plurality of first regions and the second region.

The first region A1 included in the first base body 500 includes a region where the self-emitting element layer 132 constituting a portion of the first functional layer 130 is formed in a later step. The second region A2 encloses the periphery of the region where the self-emitting element layer 132 is formed, and includes, in the second region, the cutting line SL for cutting in the later cutting step S4.

The first base body 500 prepared may be formed of an inorganic material. Specifically, the first base body 500 may be formed of glass or the like.

Moreover, the first resin layer 110 may be formed by, for example, coating, on the first base body 500, a resin varnish that is obtained by dissolving a predetermined resin in a solvent or the like, and then volatilizing the solvent.

In a later step, the first base body 500 is detached from the first resin layer 110 formed thereon. Hence, the first base body 500 is preferably formed of a material in view of the ease of detachment from the first resin layer 110 or the like, and may be formed of, for example, an inorganic material such as glass.

The first base body 500 formed of an inorganic material such as glass has weak affinity for the first resin layer 110 formed of an organic material, and therefore can be easily detached in the later step.

Figure 6B:
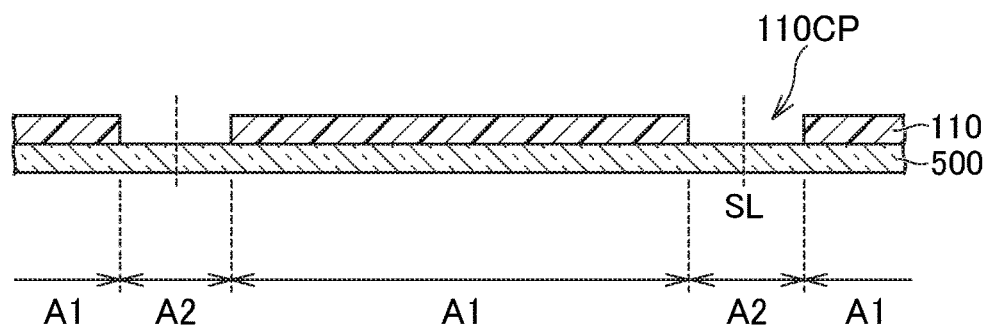
FIG. 6B is a diagram for explaining the method of manufacturing the display device according to the first embodiment, showing a state where a portion of the first resin layer is removed.

FIG. 6B is a diagram for explaining the method of manufacturing the display device according to the first embodiment, showing a state where a portion of the first resin layer is removed.

In the step of removing a portion of the first resin layer S12, in the first resin layer 110 formed in the step of forming the first resin layer S11, a portion of the first resin layer 110 formed in the second region A2 is removed. That is, only the first resin layer 110 formed in the plurality of first regions A1 is left on the first base body 500.

The removal of the portion of the first resin layer 110 in the step of removing a portion of the first resin layer S12 may be realized by, for example, patterning the first resin layer 110 using a predetermined mask.

Moreover, the removal of the portion of the first resin layer 110 in the step of removing a portion of the first resin layer S12 may be realized by, for example, applying laser ablation which is a processing technique using a laser beam. The removal of the portion of the first resin layer 110 using laser ablation can be performed without a mask. Therefore, operational cost is reduced, or there is no need to introduce a dedicated facility, and thus a reduction in manufacturing cost can be expected.

Figure 6C:
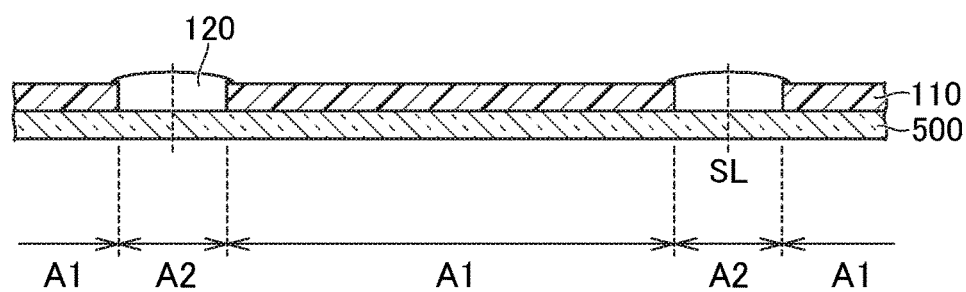
FIG. 6C is a diagram for explaining the method of manufacturing the display device according to the first embodiment, showing a state where a first buried layer is formed.

FIG. 6C is a diagram for explaining the method of manufacturing the display device according to the first embodiment, showing a state where the first buried layer is formed.

Since the portion of the first resin layer 110 is removed by the step of removing a portion of the first resin layer S12, a recess 110CP is formed on the first base body 500. In the step of forming the first buried layer S13, the first buried layer 120 is formed so as to be buried in the recess 110CP.

The moisture-proof property of the material forming the first buried layer 120 is higher than the moisture-proof property of the material forming the first resin layer 110. For example, when the first buried layer 120 is formed of an inorganic material having an excellent moisture-proof property, the first buried layer 120 may be formed using a CVD method, a PVD method, or an ALD method.

By forming the first buried layer 120 so as to be buried in the recess formed previously in the first resin layer 110 as described above, the first buried layer 120 can be easily formed so as to include the portion overlying the upper surface of the first resin layer 110.

Figure 6D:
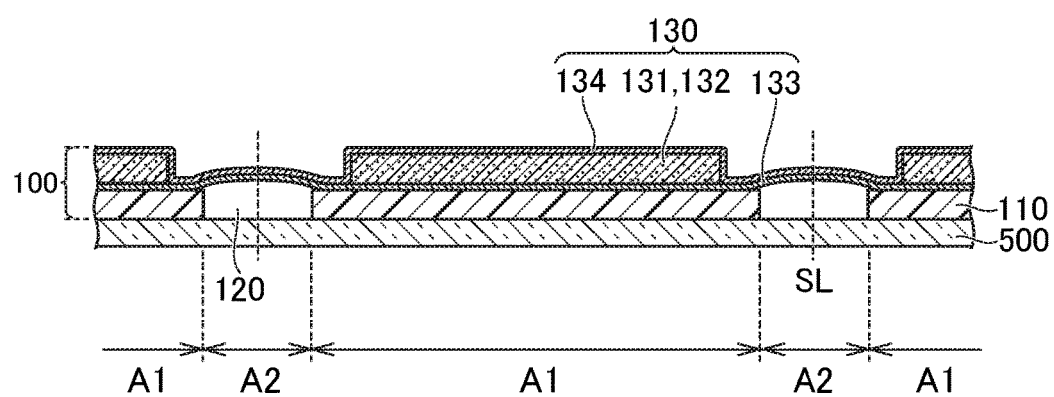
FIG. 6D is a diagram for explaining the method of manufacturing the display device according to the first embodiment, showing a state where a first functional layer including a self-emitting element layer is formed.

FIG. 6D is a diagram for explaining the method of manufacturing the display device according to the first embodiment, showing a state where the first functional layer including the self-emitting element layer is formed.

In the step of forming the first functional layer S14, the first functional layer 130 for exhibiting a display function of the display device 10 is formed. Specifically, the first functional layer 130 of the display device 10 according to the embodiment is configured to include the TFT layer 131 and the self-emitting element layer 132.

The TFT layer 131 and the self-emitting element layer 132 may be formed using a photoetching technique (a PEP technique, a photolithography technique, etc.) as a known semiconductor manufacturing process method.

Through the steps described with reference to FIGS. 6A to 6D, the step of forming the first substrate S1 is completed.

Next, the step of forming the second substrate S2 will be described with reference to FIGS. 6E to 6G. The step of forming the second substrate S2 is performed separately from the step of forming the first substrate S1 described earlier.

Figure 6E:
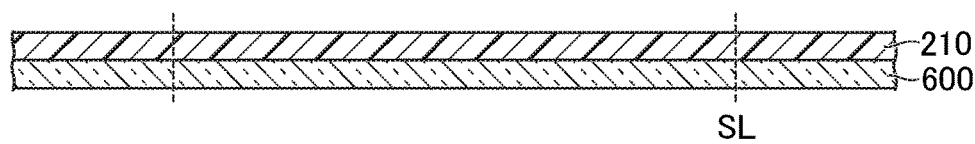
FIG. 6E is a diagram for explaining the method of manufacturing the display device according to the first embodiment, showing a state where a second resin layer is stacked on a second base body.

FIG. 6E is a diagram for explaining the method of manufacturing the display device according to the first embodiment, showing a state where the second resin layer is stacked on the second base body.

In the step of forming the second substrate S2, the flexible second resin layer 210 is formed on the second base body 600 first prepared (the step of forming the second resin layer S21). In the step of forming the second resin layer S21, the second resin layer 210 may be formed so as to cover the entire surface of the second base body 600 on one side.

The second base body 600 prepared may be formed of an inorganic material. Specifically, the second base body 600 may be formed of glass or the like.

Moreover, the second resin layer 210 may be formed by, for example, coating, on the second base body 600, a resin varnish that is obtained by dissolving a predetermined resin in a solvent or the like, and then volatilizing the solvent.

In a later step, the second base body 600 is detached from the second resin layer 210 formed thereon. Hence, the second base body 600 is preferably formed of a material in view of the ease of detachment from the second resin layer 210 or the like, and may be formed of, for example, an inorganic material such as glass.

The second base body 600 formed of an inorganic material such as glass has weak affinity for the second resin layer 210 formed of an organic material, and therefore can be easily detached in the later step.

Figure 6F:
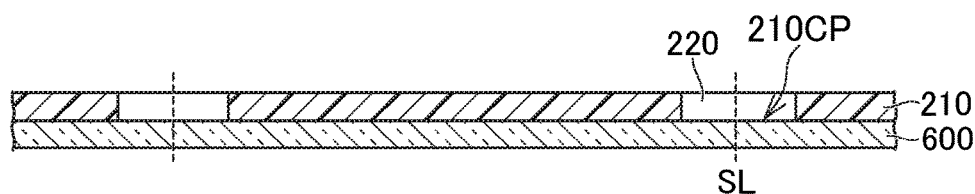
FIG. 6F is a diagram for explaining the method of manufacturing the display device according to the first embodiment, showing a state where a portion of the second resin layer is removed and then a second buried layer is formed.

FIG. 6F is a diagram for explaining the method of manufacturing the display device according to the first embodiment, showing a state where a portion of the second resin layer is removed and then the second buried layer is formed.

The second buried layer 220 is formed by burying a recess 210CP that is formed by removing a portion of the second resin layer 210 formed, with a predetermined material. The recess 210CP may be formed by, for example, a patterning method using a predetermined mask, or a method applying laser ablation as a processing technique using a laser beam.

The moisture-proof property of the material forming the second buried layer 220 may be higher than the moisture-proof property of the material forming the second resin layer 210. When the second buried layer 220 is formed of an inorganic material, the second buried layer 220 may be formed using, for example, a CVD method, a PVD method, or an ALD method.

Figure 6G:
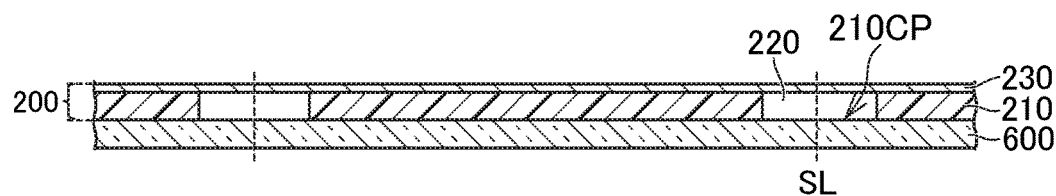
FIG. 6G is a diagram for explaining the method of manufacturing the display device according to the first embodiment, showing a state where a second functional layer including a color filter layer is formed.

FIG. 6G is a diagram for explaining the method of manufacturing the display device according to the first embodiment, showing a state where the second functional layer 230 including the color filter layer 231 is formed.

The color filter layer 231 may be formed using a photoetching technique (a PEP technique, a photolithography technique, etc.) as a known method.

Through the steps described with reference to FIGS. 6E to 6G, the step of forming the second substrate S2 is completed.

Figure 6H:
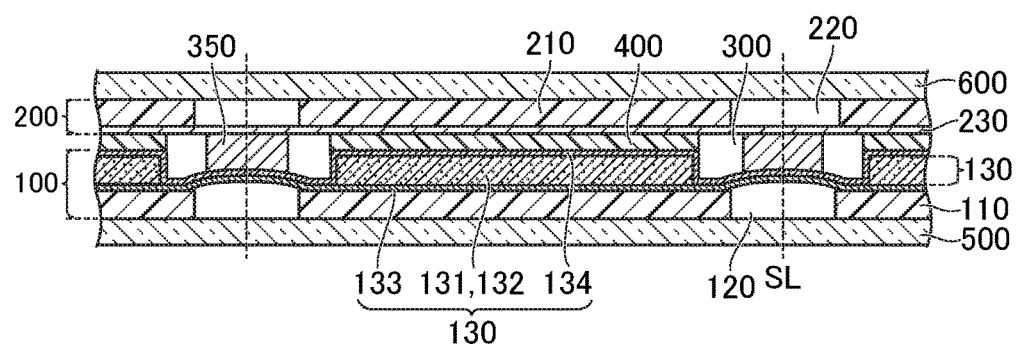
FIG. 6H is a diagram for explaining the method of manufacturing the display device according to the first embodiment, showing a state where a first substrate shown in FIG. 6D and a second substrate showing in FIG. 6G are bonded together.

Next, the first substrate 100 shown in FIG. 6D and the second substrate 200 shown in FIG. 6G are bonded together (a step of bonding the first and second substrates together S3). FIG. 6H is a diagram for explaining the method of manufacturing the display device according to the first embodiment, showing a state where the first substrate shown in FIG. 6D and the second substrate shown in FIG. 6G are bonded together.

The bonding of the substrates (the first and second substrates 100 and 200) may be performed through the sealing material 300 provided around the first buried layer 120 and the second buried layer 220 formed on the substrates. Then, between the first substrate 100 and the second substrate 200, the filling material 400 may be filled so as to be buried in a gap therebetween.

Moreover, in this step, in order to make the gap between the first substrate 100 and the second substrate 200 uniform, the spacer 350 may be provided at the position at which the first buried layer 120 and the first functional layer 130 are cut in the cutting step S4 to be performed later, that is, on the cutting line SL along which the first buried layer 120 and the first functional layer 130 are cut.

Moreover, as referred to in FIG. 6D, the second substrate 200 may be bonded to the first substrate 100 such that the second buried layer 220 provided in the second substrate 200 as a counter substrate is located at the position corresponding to the second region A2.

By bonding the substrates as described above, the first buried layer 120 and the second buried layer 220 are disposed on the line along which the first buried layer 120 and the second buried layer 220 are cut in the cutting step S4. Here, when the first buried layer 120 and/or the second buried layer 220 are/is formed of an inorganic material, there is an advantage in that cutting can be easily performed in the cutting step S4 performed later because the nature of an inorganic material is generally more fragile and breakable than an organic material.

Figure 6I:
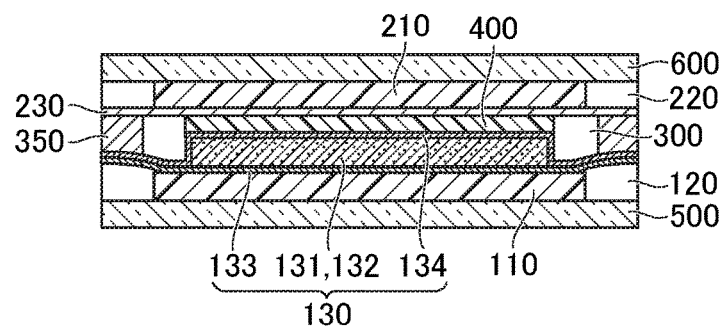
FIG. 6I is a diagram for explaining the method of manufacturing the display device according to the first embodiment, showing a state where a panel for obtaining multiple pieces is cut into units each corresponding to the display device.

Next, the substrates bonded in the step of bonding the first and second substrates together S3 are cut into units each corresponding to the display device 10 (the cutting step S4). FIG. 6I is a diagram for explaining the method of manufacturing the display device according to the first embodiment, showing a state where a panel for obtaining multiple pieces is cut into units each corresponding to the display device.

The cutting step S4 may be performed by, for example, scribing (for example, making a score using a needle made of metal or the like, or making a score with a laser beam) and braking (cutting along the scribed score) the first and second base bodies 500 and 600. That is, in the cutting step S4, the first base body 500 may be cut together with the first buried layer 120 and the first functional layer 130. Moreover, in the cutting step S4, the second substrate 200 may be cut together with the first buried layer 120 and the first functional layer 130.

Next, the first and second base bodies 500 and 600 cut are detached from the substrates in the state of being cut into the units each corresponding to the display device 10 (a step of removing the base body (glass substrate) S5).

Figure 6J:
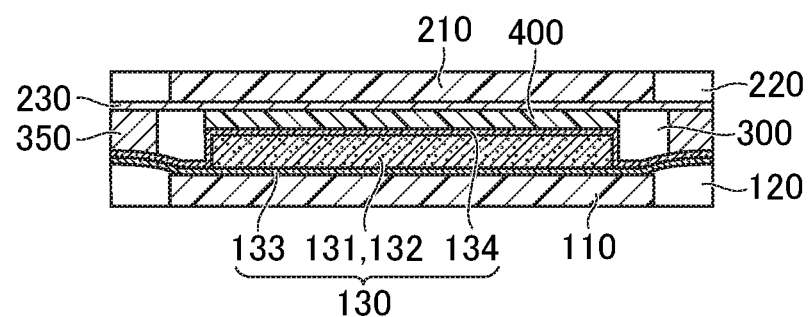
FIG. 6J is a diagram for explaining the method of manufacturing the display device according to the first embodiment, showing a state where the first and second base bodies are detached.

FIG. 6J is a diagram for explaining the method of manufacturing the display device according to the first embodiment, showing a state where the first and second base bodies are detached.

As has been described earlier, since the first and second base bodies 500 and 600 formed of an inorganic material such as glass have weak affinity for the first and second resin layers 110 and 210 formed of an organic material, the first and second base bodies 500 and 600 can be easily detached in this step.

Finally, the first protective film 140 for preventing the entry of external moisture or an external physical damage is attached on a surface of the first resin layer 110 from which the first base body 500 is detached and thus which is exposed (a step of forming the protective film S6).

In the step of forming the protective film S6, the second protective film (not shown) for preventing a physical damage may be attached on a surface of the second resin layer 210 from which the second base body 600 is detached and thus which is exposed.

Figure 6K:
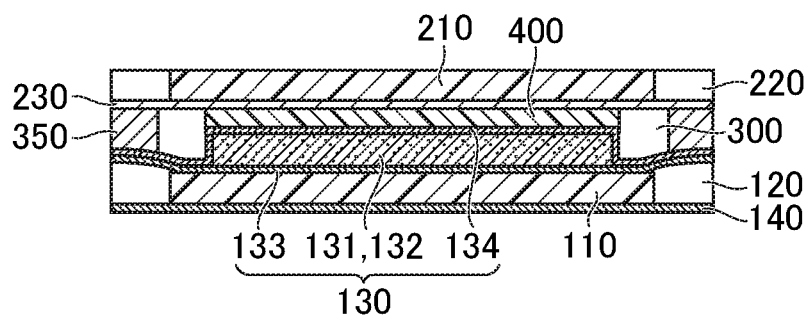
FIG. 6K is a diagram for explaining the method of manufacturing the display device according to the first embodiment, showing a state where a protective film is attached and the display device according to the first embodiment is completed.

FIG. 6K is a diagram for explaining the method of manufacturing the display device according to the first embodiment, showing a state where the protective film is attached and the display device according to the first embodiment is completed. As shown in FIG. 6K, the first protective film 140 is disposed on the side of the first resin layer 110 opposite to the side where the first functional layer 130 is disposed.

Through the steps described above, the display device 10 according to the first embodiment can be obtained.

The display device 10 obtained through the manufacturing steps described above is a display device 10 including: a resin layer; a frame body provided around the resin layer so as to include a portion overlying an upper surface of the resin layer; and a self-emitting element layer 132 stacked on the upper surface of the resin layer and an upper surface of the frame body and emitting light whose luminance is controlled for each of a plurality of unit pixels constituting an image.

Moreover, the display device 10 obtained through the manufacturing steps described above is a display device 10 whose moisture barrier property is enhanced and thus whose reliability is improved.

[Display Device According to Third Embodiment]

Figure 7:
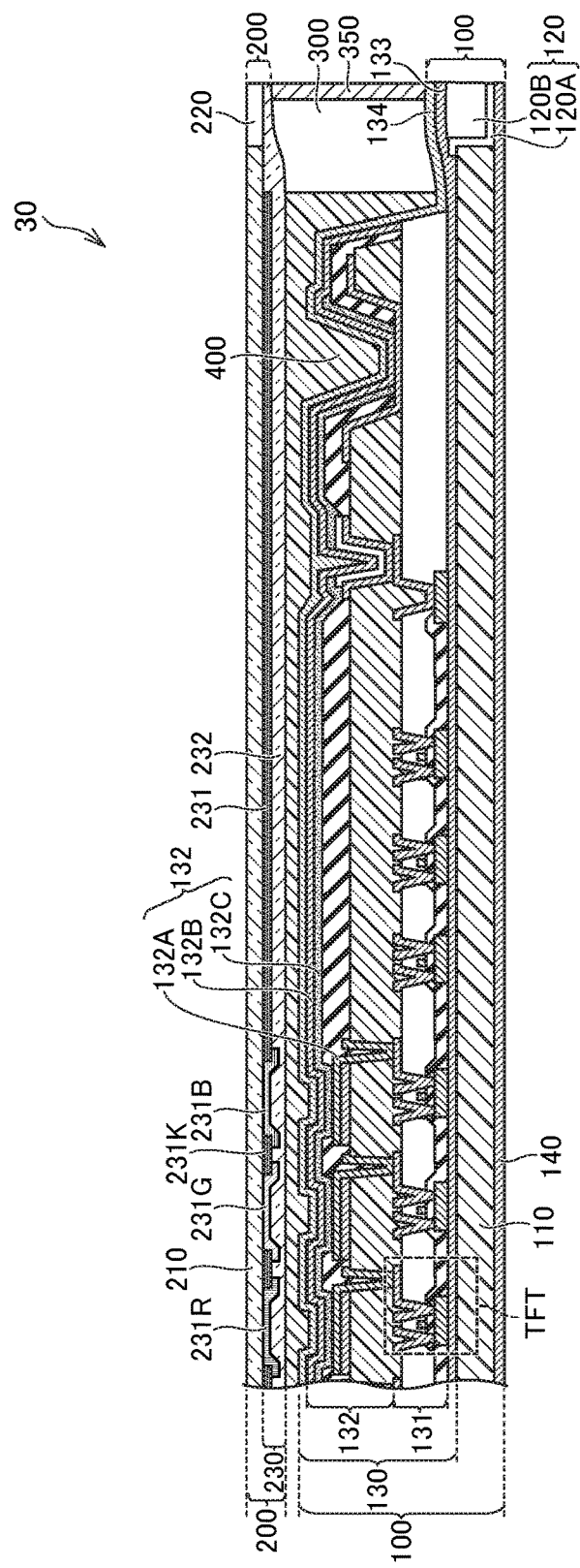
FIG. 7 is a cross-sectional view showing the configuration of a display device according to a third embodiment.

Hereinafter, a display device 30 according to a third embodiment of the invention will be described with reference to FIG. 7. FIG. 7 is a cross-sectional view showing the configuration of the display device according to the third embodiment.

In the display device 30 according to the third embodiment, the shape of the first buried layer 120 is different from the shape of the first buried layer 120 provided in the display device 10 according to the first embodiment. The configuration of the display device 30 according to the third embodiment other than the first buried layer 120 is similar to that of the display device 10 according to the first embodiment.

The first buried layer 120 constituting a portion of the display device 30 according to the third embodiment is composed of two portions. More specifically, a portion of the first buried layer 120 overlying the upper surface of the first resin layer is formed of a first inorganic insulating film 120A formed by CVD, PVD, ALD, or the like.

The first inorganic insulating film 120A may be a film formed of a material such as AlO, SiO, SiN, SiC, SiCN, SiON, or SiOCN. When the film is formed of the material by CVD, PVD, ALD, or the like, the first inorganic insulating film 120A is formed as a denser film.

The first inorganic insulating film 120A of high density has a high capability to block moisture and gas, and as a result, the reliability of the display device 30 is further enhanced. On the other hand, it is difficult to forma coating having a large film thickness for the first inorganic insulating film 120A because of the process.

Therefore, the display device 30 according to the third embodiment includes, in addition to the first inorganic insulating film 120A, a second inorganic insulating film 120B formed of spin on glass (SOG), phosphorus silicon glass (PSG), boron phosphorus silicon glass (BPSG), or the like.

The second inorganic insulating film 120B formed of SOG, PSG, BPSG, or the like is of low density compared with the first inorganic insulating film 120A; on the other hand, a coating having a large film thickness can be formed because of the characteristics of the material, and thus the second inorganic insulating film 120B has excellent burying characteristics.

As described above, since the first buried layer 120 is composed of the two inorganic insulating films different in density, the thickness of the first buried layer 120 is larger than the thickness of the first resin layer 110. With this configuration, it is possible to suppress a reduction in sealing property due to the sealing material 300 entering the recess 110CP, or to inhibit the spacer 350 from entering the recess 110CP and making the gap between the substrates non-uniform.

Moreover, since the first buried layer 120 of the display device 30 according to the third embodiment, which is formed of an inorganic material, is provided on the cutting line SL, there is an advantage in that cutting can be easily performed in the manufacturing process.

[Display Device According to Fourth Embodiment]

Hereinafter, a display device 40 according to a fourth embodiment of the invention will be described with reference to FIG. 8. FIG. 8 is a cross-sectional view showing the configuration of the display device according to the fourth embodiment.

In the display device 40 according to the fourth embodiment, the shape of the first buried layer 120 is different from the shape of the first buried layer 120 provided in the display device 10 according to the first embodiment. The configuration of the display device 40 according to the fourth embodiment other than the first buried layer 120 is similar to that of the display device 10 according to the first embodiment.

The first buried layer 120 constituting a portion of the display device 40 according to the fourth embodiment is provided around the first resin layer 110 in a plan view, and also provided so as to cover the entire upper surface (surface on the side facing the TFT layer 131) of the first resin layer 110.

Moreover, the first buried layer 120 constituting a portion of the display device 40 according to the fourth embodiment is composed of two portions, similarly to the first buried layer 120 constituting a portion of the display device 30 according to the third embodiment.

The portion of the first buried layer 120 covering the entire upper surface of the first resin layer 110 is formed of the first inorganic insulating film 120A formed by CVD, PVD, ALD, or the like. Moreover, the display device 40 according to the fourth embodiment includes, in addition to the first inorganic insulating film 120A, the second inorganic insulating film 120B formed of SOG, PSG, BPSG, or the like.

Since the first inorganic insulating film 120A covers the entire upper surface of the first resin layer 110 as described above, the reliability of the display device 40 is further enhanced.

In the display device 40 according to the fourth embodiment shown in FIG. 8, the first barrier layer 133 constituting a portion of the first functional layer 130 is provided; however, since the first inorganic insulating film 120A is provided, the first barrier layer 133 may be omitted.

[Method of Manufacturing Display Device According to Third Embodiment]

Next, a method of manufacturing the display device according to the third embodiment will be described. The manufacture of the display device 30 according to the third embodiment is performed according to the flow shown in FIG. 5, similarly to the manufacture of the display device 10 according to the first embodiment.

Hereinafter, the steps in the method of manufacturing the display device 30 according to the third embodiment will be described with reference to FIGS. 9A to 9K.

Figure 9A:
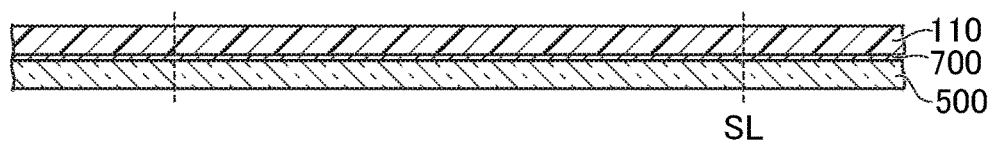
FIG. 9A is a diagram for explaining a method of manufacturing the display device according to the third embodiment, showing a state where the first resin layer is stacked on the first base body.

FIG. 9A is a diagram for explaining the method of manufacturing the display device according to the third embodiment, showing a state where the first resin layer is stacked on the first base body.

In the manufacture of the display device according to the third embodiment, the flexible first resin layer 110 is formed on the first base body 500 first prepared (the step of forming the first resin layer S11). The step of forming the first resin layer S11 is a step of preparing the first base body 500 including the plurality of first regions and the second region having the shape surrounding each of the first regions, and forming the first resin layer 110 in the plurality of first regions and the second region.

In the manufacture of the display device 30 according to the third embodiment, a sacrificial peeling layer 700 is previously formed on a surface of the first base body 500 where the first resin layer 110 is formed. The sacrificial peeling layer 700 may be formed of, α-carbon, α-Si, a metal thin film, or the like.

Here, similarly to the manufacture of the display device 10 according to the first embodiment described earlier, also in the manufacture of the display device 30 according to the third embodiment, a step of removing the first base body 500 (the step of removing the base body (glass substrate) S5) is performed later.

For example, the detachment of the sacrificial peeling layer 700 formed of the material exemplified above from the first resin layer 110 is facilitated compared with the detachment of the first base body 500 from the first resin layer 110. With this configuration, the step of removing the first base body 500 (the step of removing the base body (glass substrate) S5) can be more easily carried out.

The sacrificial peeling layer 700 can be used also in the manufacture of the display device 10 according to the first embodiment described earlier.

As the first base body 500 prepared in the manufacture of the display device 30 according to the third embodiment or the first resin layer 110, the first base body 500 or the first resin layer 110 similar to that used in the manufacture of the display device 10 according to the first embodiment can be used. Moreover, the first resin layer 110 can be formed by a method similar to the method described in the manufacture of the display device 10 according to the first embodiment.

Figure 9B:
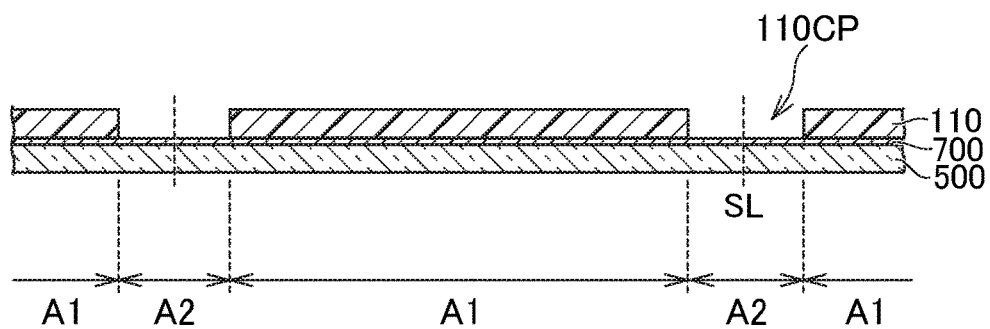
FIG. 9B is a diagram for explaining the method of manufacturing the display device according to the third embodiment, showing a state where a portion of the first resin layer is removed.

FIG. 9B is a diagram for explaining the method of manufacturing the display device according to the third embodiment, showing a state where a portion of the first resin layer is removed.

In the step of removing a portion of the first resin layer S12, in the first resin layer 110 formed in the step of forming the first resin layer S11, a portion of the first resin layer 110 formed in the second region A2 is removed. That is, only the first resin layer 110 formed in the plurality of first regions A1 is left on the first base body 500.

The removal of the portion of the first resin layer 110 in the manufacture of the display device according to the third embodiment may be performed by a method similar to the method described in the manufacture of the display device 10 according to the first embodiment.

Figure 9C:
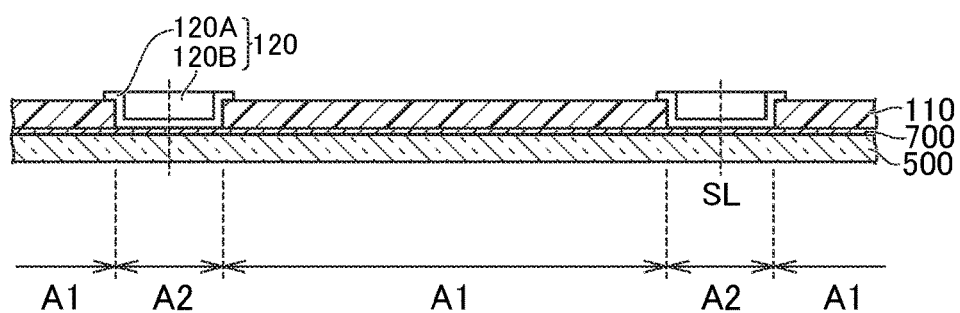
FIG. 9C is a diagram for explaining the method of manufacturing the display device according to the third embodiment, showing a state where the first buried layer is formed.

FIG. 9C is a diagram for explaining the method of manufacturing the display device according to the third embodiment, showing a state where the first buried layer is formed. In the display device 30 according to the third embodiment, the shape of the first buried layer 120 is different from the shape of the first buried layer 120 provided in the display device 10 according to the first embodiment, and the first buried layer 120 is composed of the two portions.

Since the portion of the first resin layer 110 is removed in the step of removing a portion of the first resin layer S12, the recess 110CP is formed on the first base body 500. In the step of forming the first buried layer S13, the first buried layer 120 is formed so as to be buried in the recess 110CP.

In the formation of the first buried layer 120, the first inorganic insulating film 120A serving as the portion overlying the upper surface of the first resin layer 110 is first formed using a material such as AlO, SiO, SiN, SiC, SiCN, SiON, or SiOCN by CVD, PVD, ALD, or the like.

The first inorganic insulating film 120A may be formed by temporarily forming the first inorganic insulating film 120A on the entire surface of the first resin layer 110, and then removing, while leaving only a portion of the first inorganic insulating film 120A located at the place corresponding to the recess 110CP, the other portion of the first inorganic insulating film 120A. Alternatively, the first inorganic insulating film 120A may be formed only at the place corresponding to the recess 110CP using a mask or the like.

Since it is difficult to form a coating having a large film thickness for the first inorganic insulating film. 120A, it is difficult to completely bury the recess 110CP formed by removing a portion of the first resin layer 110 with the first inorganic insulating film 120A.

Therefore, the second inorganic insulating film 120B is formed of spin on glass (SOG), phosphorus silicon glass (PSG), boron phosphorus silicon glass (BPSG), or the like on the first inorganic insulating film 120A such that the recess 110CP is completely buried with the second inorganic insulating film 120B.

The display device 40 according to the fourth embodiment can be manufactured by temporarily forming the first inorganic insulating film 120A on the entire surface of the first resin layer 110, and then forming the second inorganic insulating film 120B only at the place corresponding to the recess 110CP.

Figure 9D:
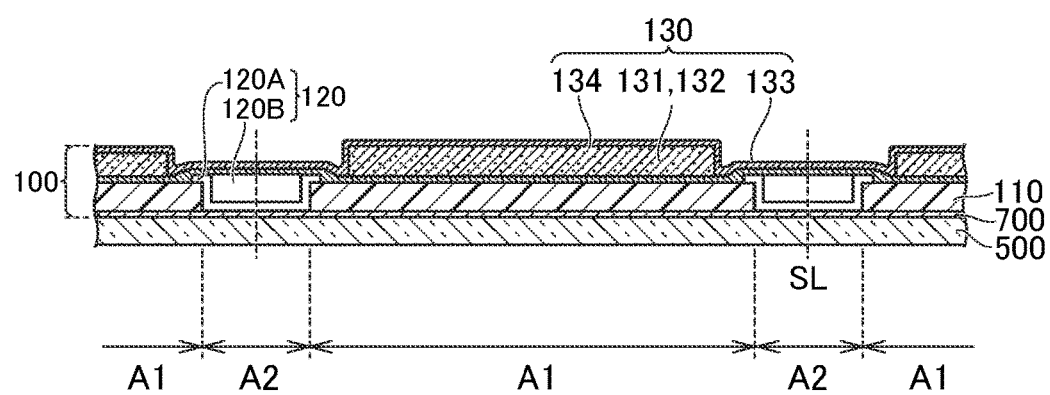
FIG. 9D is a diagram for explaining the method of manufacturing the display device according to the third embodiment, showing a state where the first functional layer including the self-emitting element layer is formed.

FIG. 9D is a diagram for explaining the method of manufacturing the display device according to the third embodiment, showing a state where the first functional layer including the self-emitting element layer is formed.

The step of forming the first functional layer S14 in the manufacture of the display device according to the third embodiment may be performed by a method similar to the method described in the manufacture of the display device 10 according to the first embodiment.

Through the steps described with reference to FIGS. 9A to 9D, the step of forming the first substrate S1 is completed.

Next, the step of forming the second substrate S2 will be described with reference to FIGS. 9E to 9G. The step of forming the second substrate S2 is performed separately from the step of forming the first substrate S1 described earlier.

Figure 9E:
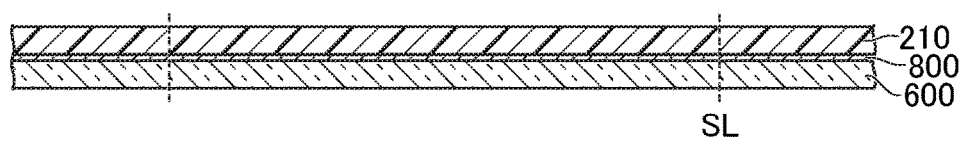
FIG. 9E is a diagram for explaining the method of manufacturing the display device according to the third embodiment, showing a state where the second resin layer is stacked on the second base body.

FIG. 9E is a diagram for explaining the method of manufacturing the display device according to the third embodiment, showing a state where the second resin layer is stacked on the second base body.

In the step of forming the second substrate S2, the flexible second resin layer 210 is formed on the second base body 600 first prepared (the step of forming the second resin layer S21). In the step of forming the second resin layer S21, the second resin layer 210 may be formed so as to cover the entire surface of the second base body 600 on one side.

Here, similarly to the sacrificial peeling layer 700, a sacrificial peeling layer 800 may be formed on the second base body 600 prepared. The sacrificial peeling layer 800 can be used also in the manufacture of the display device 10 according to the first embodiment described earlier.

As the second base body 600 prepared in the manufacture of the display device 30 according to the third embodiment or the second resin layer 210, the second base body 600 or the second resin layer 210 similar to that used in the manufacture of the display device 10 according to the first embodiment can be used. Moreover, the second resin layer 210 can be formed by a method similar to the method described in the manufacture of the display device 10 according to the first embodiment.

Figure 9F:
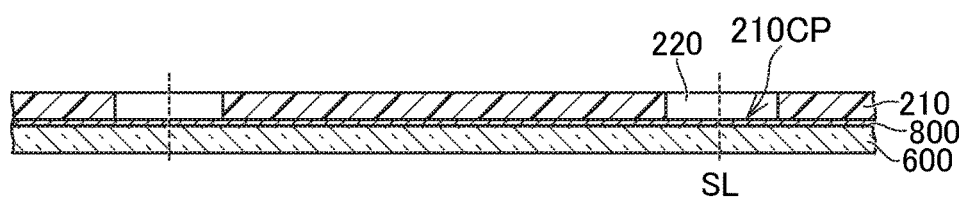
FIG. 9F is a diagram for explaining the method of manufacturing the display device according to the third embodiment, showing a state where a portion of the second resin layer is removed and then the second buried layer is formed.

FIG. 9F is a diagram for explaining the method of manufacturing the display device according to the third embodiment, showing a state where a portion of the second resin layer is removed and then the second buried layer is formed. FIG. 9G is a diagram for explaining the method of manufacturing the display device according to the third embodiment, showing a state where the second functional layer including the color filter layer is formed.

The formation of the second buried layer 220 and the formation of the color filter layer 231 can be performed by a method similar to the method described in the manufacture of the display device 10 according to the first embodiment.

Through the steps described with reference to FIGS. 9E to 9G, the step of forming the second substrate S2 is completed.

Figure 9G:
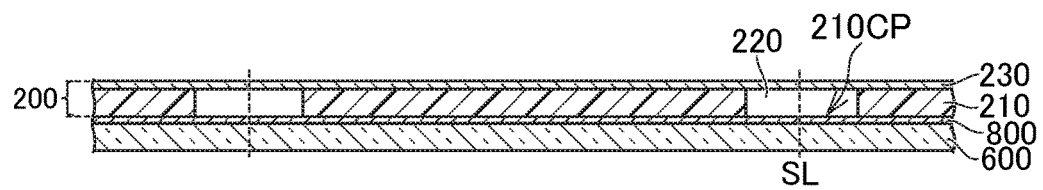
FIG. 9G is a diagram for explaining the method of manufacturing the display device according to the third embodiment, showing a state where the second functional layer including the color filter layer is formed.
Figure 9H:
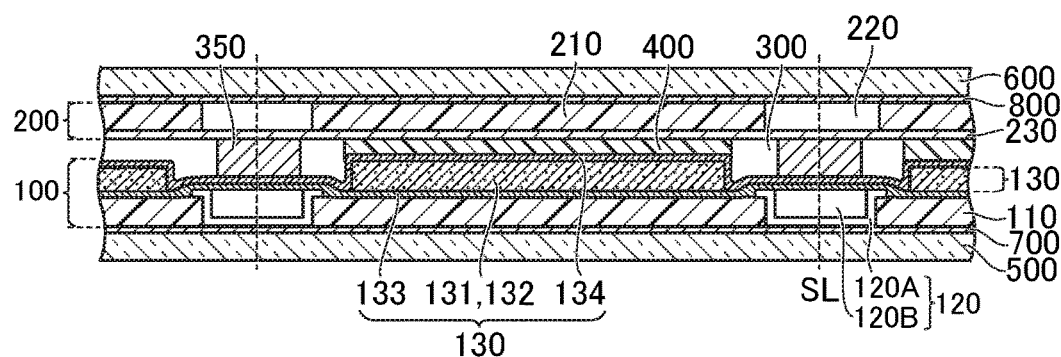
FIG. 9H is a diagram for explaining the method of manufacturing the display device according to the third embodiment, showing a state where a first substrate shown in FIG. 9D and a second substrate shown in FIG. 9G are bonded together.

Next, the first substrate 100 shown in FIG. 9D and the second substrate 200 shown in FIG. 9G are bonded together (the step of bonding the first and second substrates together S3). FIG. 9H is a diagram for explaining the method of manufacturing the display device according to the third embodiment, showing a state where the first substrate shown in FIG. 9D and the second substrate shown in FIG. 9G are bonded together.

The bonding of the substrates (the first and second substrates 100 and 200) can be performed by a method similar to the method described in the manufacture of the display device 10 according to the first embodiment.

Figure 9I:
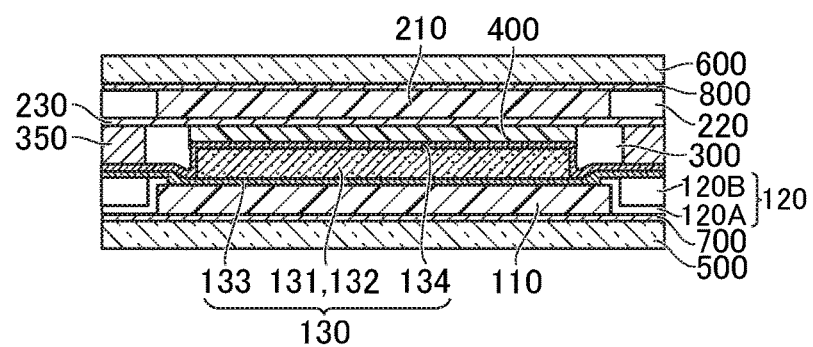
FIG. 9I is a diagram for explaining the method of manufacturing the display device according to the third embodiment, showing a state where a panel for obtaining multiple pieces is cut into units each corresponding to the display device.

Next, the substrates bonded in the step of bonding the first and second substrates together S3 are cut into units each corresponding to the display device 30 (the cutting step S4). FIG. 9I is a diagram for explaining the method of manufacturing the display device according to the third embodiment, showing a state where a panel for obtaining multiple pieces is cut into units each corresponding to the display device.

The cutting step S4 may be performed by a method similar to the method described in the manufacture of the display device 10 according to the first embodiment.

Next, the first and second base bodies 500 and 600 cut are detached from the substrates in the state of being cut into the units each corresponding to the display device 30 (the step of removing the base body (glass substrate) S5).

Figure 9J:
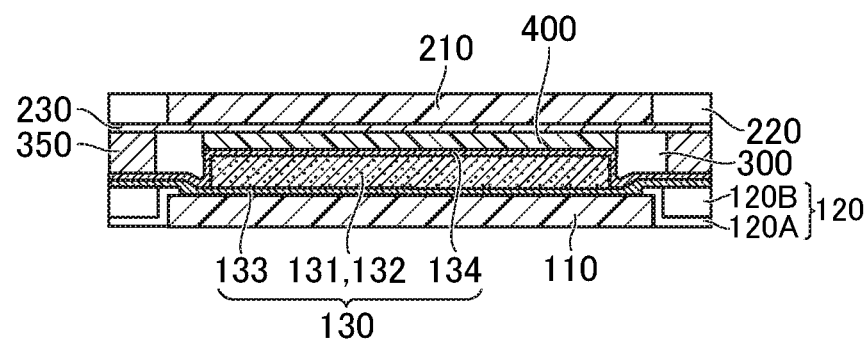
FIG. 9J is a diagram for explaining the method of manufacturing the display device according to the third embodiment, showing a state where the first and second base bodies are detached.

FIG. 9J is a diagram for explaining the method of manufacturing the display device according to the third embodiment, showing a state where the first and second base bodies are detached.

As has been described earlier, since the sacrificial peeling layers 700 and 800 are formed in the manufacture of the display device according to the third embodiment, the first and second base bodies 500 and 600 are easily detached in this step.

At the same time as the detachment of the first and second base bodies 500 and 600, the sacrificial peeling layers 700 and 800 are also detached from the first and second resin layers 110 and 210; however, a portion or the whole of the sacrificial peeling layers 700 and 800 may not be detached from the first and second resin layers 110 and 210.

Finally, the first protective film 140 for preventing the entry of external moisture or an external physical damage is attached on a surface of the first resin layer 110 from which the first base body 500 is detached and thus which is exposed (the step of forming the protective film S6).

In the step of forming the protective film S6, the second protective film (not shown) for preventing a physical damage may be attached on a surface of the second resin layer 210 from which the second base body 600 is detached and thus which is exposed.

Figure 9K:
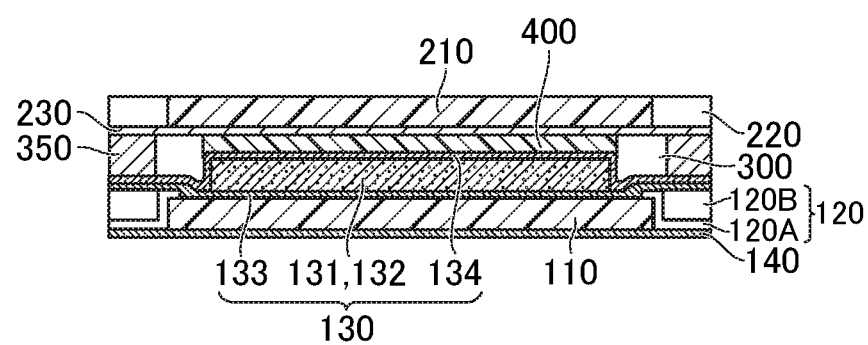
FIG. 9K is a diagram for explaining the method of manufacturing the display device according to the third embodiment, showing a state where the protective film is attached and the display device according to the third embodiment is completed.

FIG. 9K is a diagram for explaining the method of manufacturing the display device according to the third embodiment, showing a state where the protective film is attached and the display device according to the third embodiment is completed. As shown in FIG. 9K, the first protective film 140 is disposed on the side of the first resin layer 110 opposite to the side where the first functional layer 130 is disposed.

Through the steps described above, the display device 30 according to the third embodiment can be obtained.

The display device 30 obtained through the manufacturing steps described above is a display device 30 including: a resin layer; a frame body provided around the resin layer so as to include a portion overlying an upper surface of the resin layer; and a self-emitting element layer 132 stacked on the upper surface of the resin layer and an upper surface of the frame body and emitting light whose luminance is controlled for each of a plurality of unit pixels constituting an image.

Moreover, the display device 30 obtained through the manufacturing steps described above is a display device 30 whose moisture barrier property is enhanced and thus whose reliability is improved.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method of manufacturing a display device, comprising the steps of:
    preparing a base body including a plurality of first regions and a second region having a shape surrounding each of the first regions, and forming a resin layer in the plurality of first regions;
    forming, in the second region, a buried layer that is made of silicon glass and has a moisture-proof property higher than the resin layer, the buried layer including a first portion directly overlying an upper surface of the resin layer and a second portion surrounding a peripheral edge of the resin layer;
    forming, on the buried layer and the resin layer, an overcoat layer that includes a metal oxide material or a metal nitride material;
    forming, on the overcoat layer, a functional layer that includes pixels, each of the pixels including an organic light emitting element; and
    cutting the buried layer and the functional layer along a line passing through the second region, so as to separate the resin layer into a plurality of portions respectively corresponding to the plurality of first regions, wherein
    a first thickness of the second portion gradually decreases from a cut edge of the buried layer toward the peripheral edge of the resin layer in a cross-sectional view.

2. The method of manufacturing a display device according to claim 1, wherein
    in the step of cutting the buried layer and the functional layer, the base body is cut together with the buried layer and the functional layer.

3. The method of manufacturing a display device according to claim 2, further comprising, after the step of cutting the buried layer and the functional layer, the step of detaching the base body from the resin layer.

4. The method of manufacturing a display device according to claim 1, wherein the step of forming the resin layer in the first regions includes
   the step of forming the resin layer in the plurality of first regions and the second region of the base body prepared, and
   the step of removing, in the resin layer formed in the plurality of first regions and the second region, the resin layer formed in the second region from the base body.

5. The method of manufacturing a display device according to claim 1, further comprising, before the step of cutting the buried layer and the functional layer, the step of bonding a counter substrate to a side of the functional layer opposite to a side facing the base body, wherein
   in the step of cutting the buried layer and the functional layer, the counter substrate is cut together with the buried layer and the functional layer.

6. The method of manufacturing a display device according to claim 5, wherein the step of bonding the counter substrate includes
   the step of providing, on at least one of the counter substrate and the functional layer, a sealing material so as to surround each of regions corresponding to the plurality of first regions,
   the step of providing a filling material in each of the plurality of regions surrounded by the sealing material, and
   the step of bonding the counter substrate to the functional layer through the sealing material and the filling material.

7. The method of manufacturing a display device according to claim 6, wherein
   the step of bonding the counter substrate further includes the step of providing a spacer on a line along which the buried layer and the functional layer are cut.

8. The method of manufacturing a display device according to claim 5, wherein
   the counter substrate includes a second buried layer having a moisture-proof property higher than the resin layer, and
   in the step of bonding the counter substrate, the counter substrate is bonded such that the second buried layer is located at a position corresponding to the second region.

9. A display device comprising:
   a first resin layer;
   a first frame body which is made of silicon glass and is provided around the first resin layer so as to include a first portion directly overlying an upper surface of the first resin layer and a second portion surrounding a peripheral edge of the first resin layer;
   an overcoat layer which is arranged on the first frame body and the first resin layer and includes a metal oxide material or a metal nitride material; and
   a functional layer which is formed on the overcoat layer and includes pixels, each of the pixels including an organic light emitting element, wherein
   a first thickness of the second portion gradually decreases from an edge of the first frame body toward the peripheral edge of the first resin layer in a cross-sectional view.

10. The display device according to claim 9, further comprising a protective film disposed under the first resin layer.

11. The display device according to claim 9, wherein
    the functional layer includes a thin film transistor layer, a self-emitting element layer which includes the organic light emitting element and is formed on the thin film transistor layer, and a barrier layer formed on a side of the self-emitting element layer, and
    the barrier layer is further disposed so as to enclose a side surface of the thin film transistor layer and an edge surface of the self-emitting element layer.

12. The display device according to claim 11, further comprising a counter substrate disposed on the functional layer.

13. The display device according to claim 12, wherein
    the barrier layer and the counter substrate are bonded to each other through a filling material and a sealing material disposed so as to enclose a periphery of the filling material in a plan view.

14. The display device according to claim 13, wherein
    the overcoat layer and the barrier layer are interposed between the sealing material and the first frame body.

15. The display device according to claim 14, further comprising a spacer disposed between the barrier layer and the counter substrate.

16. The display device according to claim 13, wherein
    the counter substrate includes a second resin layer and a second frame body provided on a side surface portion of the second resin layer so as to surround a periphery of the second resin layer, and
    the second frame body is disposed such that at least a portion of the second frame body overlaps the first frame body and the sealing material in a plan view.

17. The display device according to claim 9, wherein
    a thickness of the first frame body is larger than a thickness of the first resin layer.

18. The display device according to claim 9, wherein
    the first frame body is provided around the first resin layer in a plan view, and also provided so as to cover an entire upper surface of the first resin layer.

19. The display device according to claim 15, wherein
    the sealing material is directly above an edge portion of the first resin layer and the first frame body, and
    the spacer is directly above the first frame body.

20. The display device according to claim 9, wherein
    the first portion of the first frame body has an edge portion at the position closest to the functional layer, and
    a second thickness of the first portion gradually decreases from the peripheral edge of the first resin layer toward the edge portion of the first portion of the first frame body in the cross-sectional view.

* * * * *